United States Patent [19]
Collins et al.

[11] Patent Number: 5,291,426
[45] Date of Patent: Mar. 1, 1994

[54] METHOD OF CORRECTING SPECTRAL DATA FOR BACKGROUND

[75] Inventors: John B. Collins, Westport, Conn.; Marc L. Salit, Washington, D.C.

[73] Assignee: The Perkin-Elmer Corporation, Norwalk, Conn.

[21] Appl. No.: 661,756

[22] Filed: Feb. 27, 1991

[51] Int. Cl.$^5$ .................... G06F 15/20; G06F 15/46
[52] U.S. Cl. ...................... 364/574; 364/498; 364/571.01; 364/554
[58] Field of Search .............. 364/571.01, 571.02, 364/571.04, 525, 496, 497, 498, 554, 574; 250/270; 356/307

[56] References Cited

U.S. PATENT DOCUMENTS

| | | | |
|---|---|---|---|
| 4,689,754 | 8/1987 | Collins et al. | 364/497 |
| 4,766,287 | 8/1988 | Morrisroe et al. | 356/316 |
| 4,779,216 | 10/1988 | Collins | 364/571.02 |
| 4,893,259 | 1/1990 | Grosser et al. | 364/525 |
| 4,893,259 | 1/1990 | Grosser et al. | 364/525 |
| 4,974,209 | 11/1990 | Hoult | 364/497 |
| 5,121,443 | 6/1992 | Tomlinson | 364/498 X |
| 5,124,932 | 6/1992 | Lodder | 364/498 |

OTHER PUBLICATIONS

"Handbook of Mathematical Functions" by M. Abramowitz and I. Stegun, Dover (1965).
"A New Baseline Correction Algorithm Using Objective Criteria" by J. Liu and J. L. Koenig, Applied Spectroscopy 41, 447–449 (1987).
"Applied Regression Analysis" by N. Draper and H. Smith, Wiley 2nd ed. (1981), pp. 157–162.

Primary Examiner—Kevin J. Teska
Attorney, Agent, or Firm—H. S. Ingham; E. T. Grimes; J. R. Wahl

[57] ABSTRACT

A method of producing spectral data corrected for background includes generating spectral data, ascertaining background and subtracting background points to produce the corrected data. To ascertain background the spectral data are masked initially at the spectral peak of interest, and a least squares curve is fitted to the masked data. A runs test is performed to detect whether the number of runs exceeds a selected significance level. If so, the data are further masked and a curve is refitted. These steps are iterated until no further significant number of runs is detected. Similar testing for outliers is then effected with similar masking, a final curve represents the background level.

28 Claims, 5 Drawing Sheets

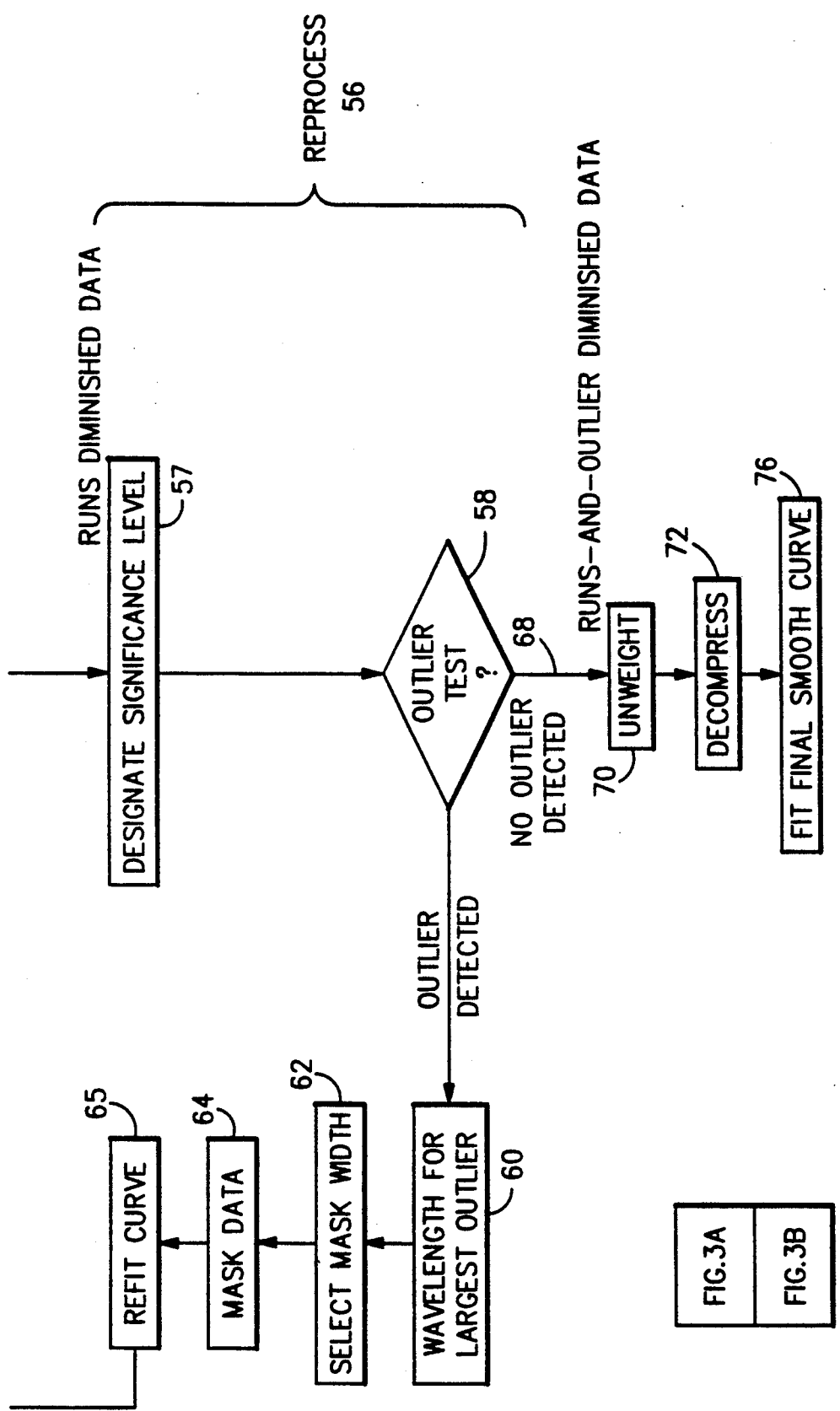

METHOD OF CORRECTING SPECTRAL DATA FOR BACKGROUND

The present invention relates to the utilization of analytical instruments such as spectrometers, and particularly to the correction of spectral data for background level.

BACKGROUND OF THE INVENTION

Spectrometers are in common use as analytical instruments to produce spectra characteristic of atomic or molecular species. One type of spectrometer utilizes an inductively coupled plasma (ICP) such as described in U.S. Pat. No. 4,766,287 of the present assignee. An analyte, i.e. a sample of matter, is injected into the plasma, and the instrument including a monochromator generates a spectrum based on emission from the plasma characteristic of the analyte. A particular spectral peak is generally utilized for measurement to determine presence and quantity of a species in the analyte. Modern instruments have computerized data stations for operating the instrument and performing such functions as calibration and standardization, as described in U.S. Pat. No. 4,893,259, also of the present assignee.

When measuring emission intensity in the ICP to infer analyte concentration, one measures the intensity of the analyte peak superimposed upon a background of non-analyte emission. This non-analyte emission is detrimental to the measurement for two reasons: It contributes to the photon shot noise associated with the measurement, degrading the signal-to-noise; and it can constitute a large part of the gross signal, such that even a small shift in the background signal may create a large relative error in concentration. The degradation of the signal-to-noise ratio of the measurement (and hence detection limits) due to the additional shot noise resulting from the background interference on the signal is unavoidable and cannot be compensated for. The effect of background shifts on apparent analyte concentration can, however, be compensated for by the separation of the net analyte signal from the gross, measured emission signal. Background emission in the ICP has been characterized as arising from such sources as continuum radiation, stray light, recombination spectra, and line broadening.

Background level in the spectrum generally is determined in one of two ways. One is to generate spectra without the analyte and utilize these in calibration for subtraction from the desired spectrum of the analyte. This approach does not account for time variations in the plasma, effects from analyte solvent, or other such variations. Another way is direct measurement of background in the spectrum of interest at one or preferably two selected wavelengths displaced from the selected peak of the analyte. This requires some method such as operator judgement to avoid picking wavelengths where other non-background peaks occur, such as from another species.

In an application of the second method, utilized in ICP instruments such as the Plasma II spectrometer produced and sold by The Perkin-Elmer Corporation, a "heuristic" analysis is applied to a spectrum by way of an algorithm. This automates background estimation by selecting two wavelengths using heuristic rules or rules-of-thumb. Briefly, this operates as follows: The measured spectrum is smoothed to enhance the signal-to-noise ratio; the second derivative of the smoothed spectrum is calculated; zero crossings of the second derivative are tabulated; the different spectral regions are identified by their "signatures", according to densities of zero crossings; candidate wavelengths are selected with heuristic rules; the candidates are scored with the rules; and the best two scoring wavelengths are selected to estimate the background intensity at the analyte wavelength. The candidate wavelengths will have a high number of clustered zero crossings, reflecting lack of a particular peak at these wavelengths.

The heuristic approach has been quite useful, but results in a small but real positive error or bias in background estimation, and there are significant occurrences of catastrophically erroneous estimations when large non-analyte features are present. It also is sensitive to instrument bandpass and number of data in a bandpass.

Another method is disclosed in "A New Baseline Correction Algorithm Using Objective Criteria" by J. Liu and J. L. Koenig, *Applied Spectroscopy* 41, 447–449 (1987). Spectral background data are fitted to a curve by least squares, and points are rejected whose values are a standard error of estimate or more above the line. The fitting is performed again with the remaining data points. The procedure is repeated until the changes in the estimated parameters are within some preset tolerances or until the number of data points is less than a selected number.

SUMMARY OF THE INVENTION

An object of the invention is improvement in producing analytical data such as spectral data corrected for background level. Another object includes a novel method of ascertaining background level. A further object is to produce spectral data corrected for background level, in which the background level is ascertained from the spectral data with minimized bias and catastrophic occurrences.

The foregoing and other objects are achieved by a method of producing spectral data corrected for background level, with an analytical instrument including means for effecting a spectrum (or other functional signal) having a background level and a spectral peak at a characteristic wavelength, means receptive of the spectrum for generating spectral data as discrete data points, and means for processing and displaying the spectral data. The method comprises operating the instrument so as to generate a set of spectral data, ascertaining background level in the spectral data, subtracting points in the background level from corresponding discrete data points to produce corrected spectral data, and displaying the corrected spectral data.

The step of ascertaining background level comprises the following steps: Initially mask the spectral data at the characteristic wavelength over a preselected masking width, thereby modifying the spectral data into a set of initially diminished data. Initially fit a smooth curve to the initially diminished data, such as by a least squares fit to a straight line, and calculate residuals of the diminished data with respect to the smooth curve. Process the spectral data by selecting a statistical significance level, and performing a runs test on the residuals so as to detect whether number of runs is significant with respect to the significance level. If the number is significant, further process the data by determining a selected wavelength preferably as the wavelength for the largest residual, masking the diminished data at the selected wavelength over a selected masking width, refitting a smooth curve to the masked diminished data, and recalculating residuals. Iterate, with residuals for cumulatively masked diminished data, the foregoing steps of processing until the number of runs is not significant, thereby further modifying the spectral data into a set of runs diminished data. Employ runs diminished data in fitting a final smooth curve representing the background level for producing the corrected spectral data.

In a preferred embodiment, utilizing a runs-diminished smooth curve that remains fitted to the runs diminished data, the step of employing comprises the following steps: Reprocess the spectral data by designating a statistical significance level, and executing a parametric outlier test on the runs-diminished data with respect to the runs diminished smooth curve so as to detect a largest outlier exceeding the significance level. If such a largest outlier exists, further reprocess the data by determining an outlier wavelength for said outlier, masking the runs diminished data at the outlier wavelength over a selected masking width, and refitting a smooth curve to the masked runs diminished data. Iterate, with cumulatively masked runs diminished data, the steps of reprocessing until no further outlier exceeding the significant level is detected, thereby further modifying the spectral data into a set of runs-and-outlier diminished data. Utilize the runs-and-outlier diminished data in fitting the final smooth curve.

Advantageously the step of ascertaining further comprises, prior to the step of initially fitting, weighting the spectral data inversely with wavelength distance from the characteristic wavelength, and compressing the data with a logarithmic transform. The step of utilizing then includes decompressing the runs-and-outlier diminished data prior to fitting the final smooth curve.

Preferably the significance level is decreased from a initial significance level successively for each subsequent step of performing. Also, the selected masking width is decreased successively for each step of masking.

DETAILED DESCRIPTION OF THE INVENTION

Those skilled in the art will recognize that the present invention can be used in various types of analytical instruments such as visible, infrared, ultraviolet and x-ray spectrometers (including laboratory and astronomical), and gas and liquid chromatography instruments. The inventory is particularly advantageous with respect to an inductively coupled plasma spectrometer, for example the aforementioned Plasma II of The Perkin-Elmer Corporation. In such an instrument the plasma provides an energy source into which an analyte is injected so as to effect light emissions at various wavelengths and strengths depending on composition of the analyte.

Typically a portion or wavelength range of the total spectrum is selected for analysis, the portion containing a selected spectral peak at a characteristic wavelength representing an atomic (or other) species in the analyte. The usual procedure is to measure the height or area of the peak as a quantative measure of the selected species. To achieve this accurately a background level must be ascertained and subtracted from the spectrum.

The background level is determined from the region in the spectrum away from the primary peak, but other peaks in the spectrum may also be present to interfere with the determination. These other peaks or features are due to shot-noise and emissions from non-analyte sources such as further light from the plasma and other extraneous sources. The invention herein is directed to ascertaining the steady noise-type background level, without the extraneous peaks, from the spectrum.

Figure 1:
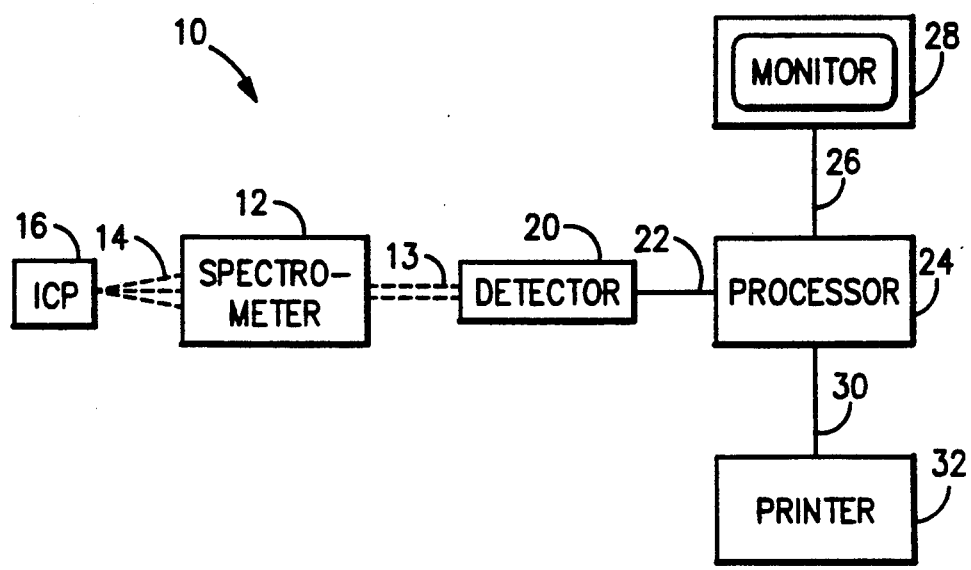
FIG. 1 is a block diagram of an analytical instrument for implementing the invention.

An instrument 10 incorporating the present invention (FIG. 1) includes a spectrometer 12 which is operated to effect a spectrum 13 from the light 14 emitted by an analyte in an inductively coupled plasma (ICP) 16. The instrument includes a detector means 20 receptive of the spectrum 13 for generating corresponding spectral data conveyed in signals on a line 22 to a processing unit 24 for storage in the form of discrete data points. The processor may include a keyboard and disk drive (neither shown) for operator input of operating parameters, and the processor may effect other operations not associated directly with the present invention, such as calibration, spectral band selection, and the like. The data points represent the spectrum at suitable increments of wavelength, such as 0.001 nm. For example there may be about 10 increments for one band width of the primary peak. The spectral data are processed by unit 24 to ascertain the background and subtract points in the background level from corresponding discrete spectral data points. The results are fed as further signals via a line 26 for display on a monitor 28 or a line 30 for a printout 32.

Figure 2A:
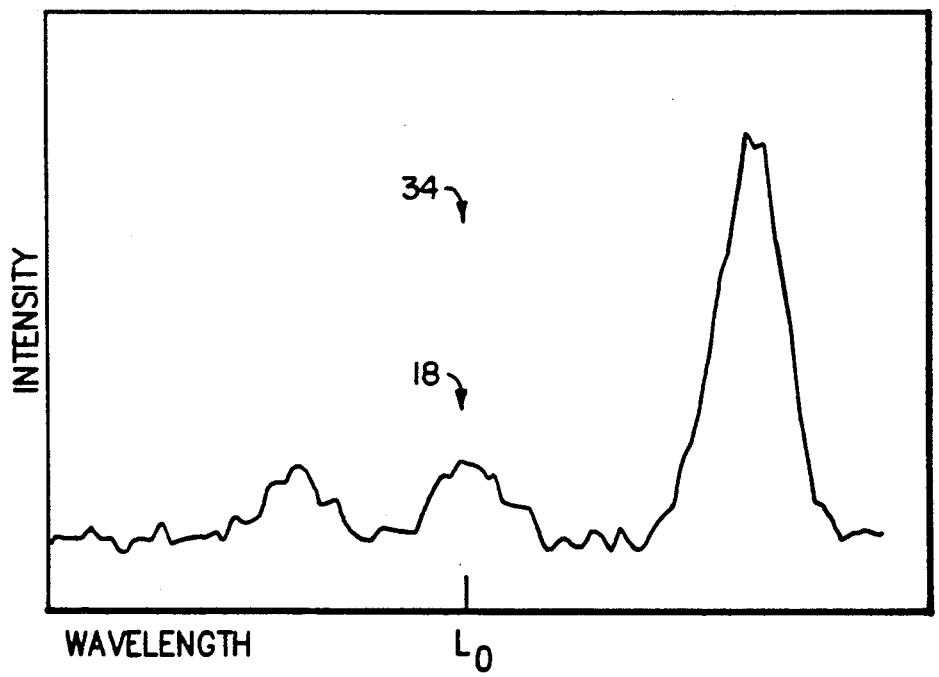
FIGS. 2A-2E illustrate a set of spectral data generated by the instrument of FIG. 1 and successively treated according to the invention.

FIG. 2A represents a synthetic spectrum 34 for illustration, in which the central peak is a selected peak 18 for an analyte at a characteristic wavelength $L_o$. The processing steps are illustrated by the flow chart of FIG. 3. The original full spectral data 34 (over the selected range) is treated by initially masking 36 the spectral data at the characteristic wavelength over a preselected initial masking width, thereby modifying the spectral data into a set of initially diminished data. The selection of masking width is explained below.

Figure 2B:
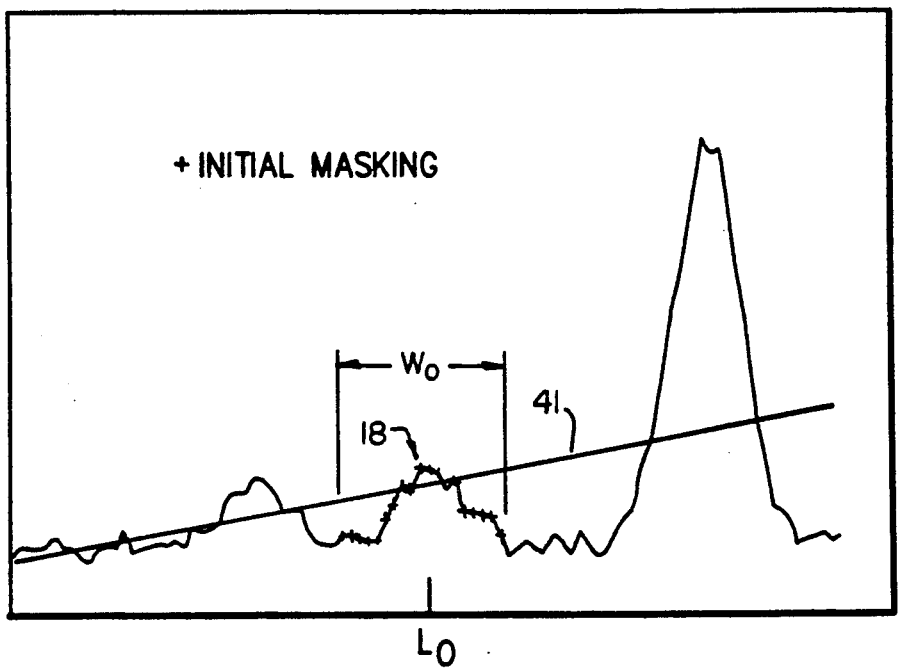

The points are initially masked over width $W_o$ as indicated in FIG. 2B by the symbols entered on the curve at the wavelength increments. The next steps of compress 38 and weight 40 are described below. A smooth curve 41 (straight line) is fitted 42 to the initially diminished data by the least squares method or the like. The type of curve depends on the nature of the data. In the case of ICP spectra, a straight line is preferred. In other circumstances a quadratic, sinusoidal, exponential or other such curve may be more suitable.

The data are then processed 44 as follows: Residuals (differences between the data and the curve) are calculated 43, conveniently as part of the curve fitting subroutine. A statistical significance level is selected 46, as described in detail below. A runs test 47 is performed on the residuals so as to determine the number of runs (of consecutive residuals having the same mathematical sign), and whether such number is significant with respect to the selected significance level. Preferably a non-parametric runs test is utilized, generally assuming a normal distribution. The application of this test is based on the fact that non-noise (non-background) spectral features, which are to be identified and eliminated for the background determination, will create "runs" of positive and negative residuals from the fitted curve. The magnitudes of the residuals are not examined, only their mathematical signs. A preferred test is the Wodld-Wolfowitz runs test described in standard texts on statistics, for example "Applied Regression Analysis" by N. Draper and H. Smith, Wiley 2nd ed. (1981), pp. 157-162. With further reference to formulae No. 26.2.22 in "Handbook of Mathematical Functions" by M. Abramowitz and I. Stegun, Dover (1965), this runs test utilizes the following formulae:

$$M = \frac{2n_1 n_2}{n_1 + n_2} + 1$$

$$S^2 = \frac{2n_1 n_2 (2n_1 n_2 - n_1 - n_2)}{(n_1 + n_2)^2 (n_1 + n_2 - 1)}$$

$$Z = (N - M + 1/2)/S$$

where
$n_1$ = number of positive residuals;
$n_2$ = number of negative residuals;
$N = n_1 + n_2$ = total number of residuals;
$Z$ = unit normal deviate.

$$Z_p = w - \frac{c_0 + c_1 w + c_2 w^2}{1 + d_1 w + d_2 w_2 + d_3 w^3}$$

$$w = [\ln(1/p^2)]^{\frac{1}{2}}$$

where
p = significance level (probability of Z greater than $Z_p$);
$c_0 = 2.515517$
$d_1 = 1.432788$
$c_1 = 0.802853$
$d_2 = 0.189269$
$c_2 = 0.010328$
$d_3 = 0.001308$ If Z is greater than $Z_o$, the number of runs is deemed significant.

Figure 2C:
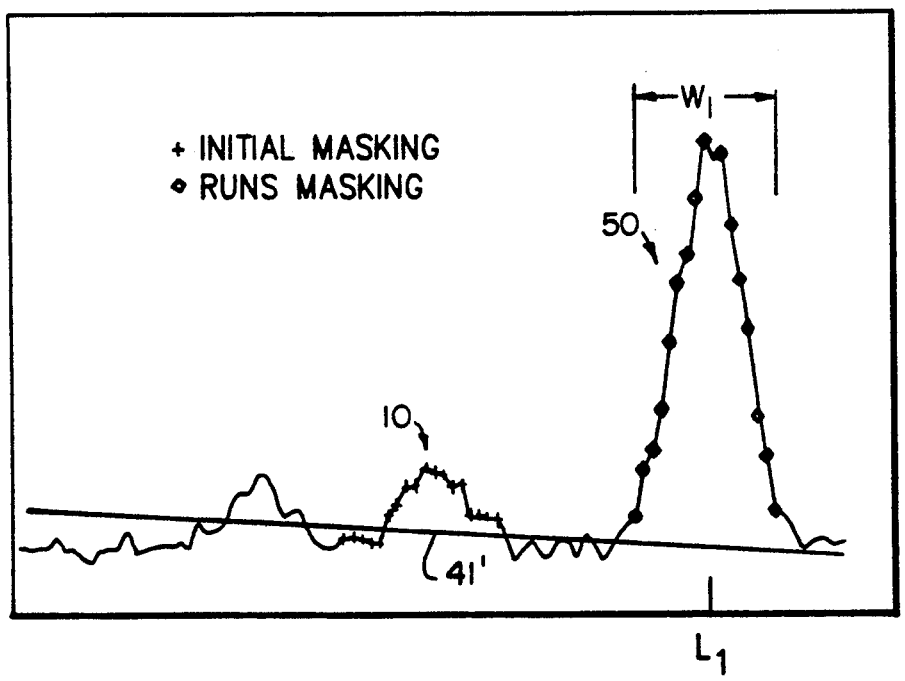
Figure 2D:
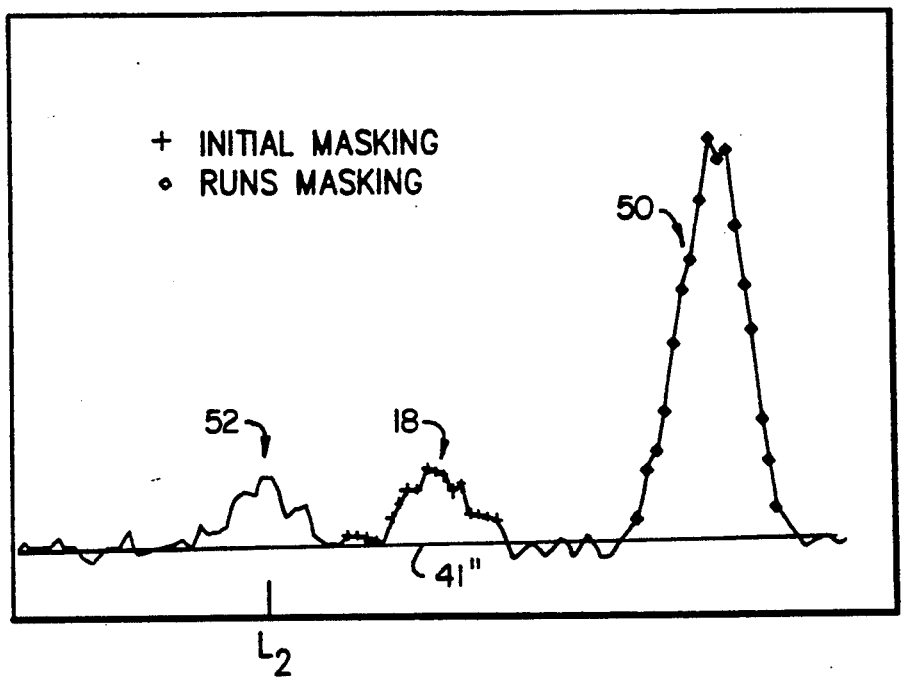

If the runs test detects that the number of runs is significant with respect to the selected significance level, the largest residual in the data set is determined, and the wavelength $L_1$ for this residual is selected 48; as a less preferable alternative, the largest run (i.e. with highest number of consecutive plus or minus) is determined, and the median wavelength for this run is selected. A subsequent masking width is selected 49, and the diminished data is further masked 51 at the subsequent wavelength over the selected masking width $W_1$, as shown in FIG. 2C where the high peak 50 (which is higher than the primary peak) on the right caused significant runs in the runs test 47. The masking width, as mentioned, is explained below. The smooth curve 41' is again fitted 53, this time to the masked diminished data. After a counting step 55, iterations are then effected back through the above processing steps 44, with residuals for cumulatively masked diminished data. FIG. 2D shows a small peak 52 at wavelength $L_2$ on the left masked by the next iteration after the first processing step. In the present example, another iteration detects that the number of runs is not significant, and these iterations are terminated 54.

Figure 3A:
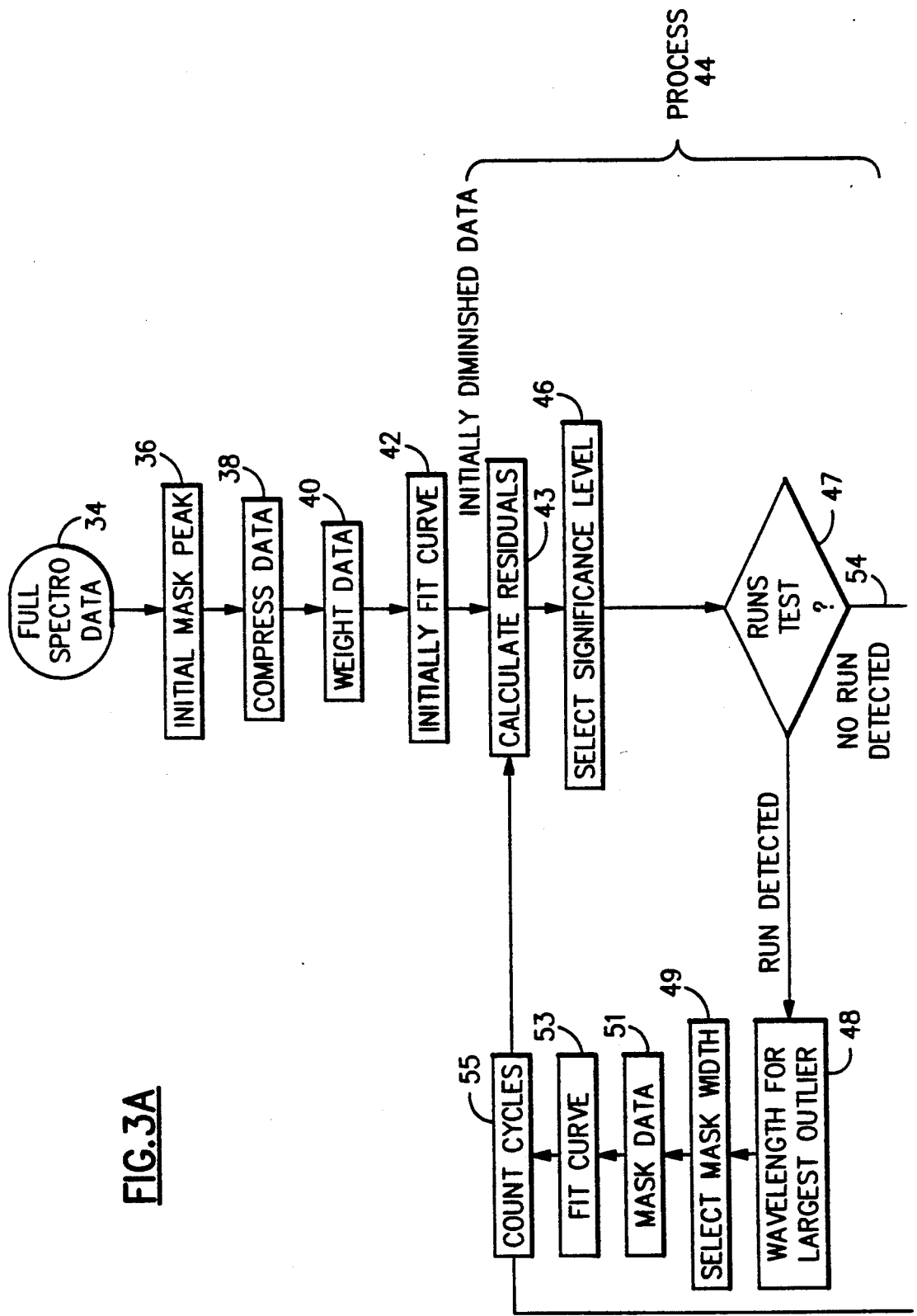
FIG. 3 is a flow chart for ascertaining background level from the spectral data of FIGS. 2A-2E.

The remaining spectral data at this stage are designated herein and in the claims as "runs diminished data" which are employed as-is or after further treatment in fitting a final smooth curve. This final curve represents the background level for producing the corrected spectral data. A "runs diminished smooth curve" 41" (FIG. 2D) is the curve that last remains fitted to this runs diminished data after the above iterations are terminated. In a simple embodiment of the invention, this curve can be employed as the final curve for the background level. For better accuracy, in the preferred embodiment of FIG. 3 the runs diminished data are further masked before the final smooth curve is fitted to them. The further masking is achieved by steps of reprocessing 56 of the spectral data starting with the runs diminished stage of the data where no significant number of runs has been detected. A statistical significance level 57 is designated (FIG. 3).

An outlier test 58 is executed on the residuals of the runs diminished data with respect to the runs diminished smooth curve, so as to detect outliers exceeding the designated significance level, and particularly the largest outlier. This test should be parametric. A conventional outlier test, particularly one known as a Student's T-test, is utilized. Briefly, the residuals (the differences of the diminished data from the curve) are arranged in order of decreasing magnitude and the largest is selected for testing by the statistic T which is computed with formula No. 26.7.5 of the aforementioned handbook by Abramowitz et al:

$$T = Rt$$

$$t = Z_p + \frac{g_1}{(N-1)} + \frac{g_2}{(N-1)^2} + \frac{g_3}{(N-1)^3} + \frac{g_4}{(N-1)^4}$$

$$g_1 = (Z_p^3 + Z_p)/4$$

$$g_2 = (5Z_p^5 + 16Z_p^3 + 3Z_p)/96$$

$$g_3 = (3Z_p^7 + 19Z_p^5 + 17Z_p^3 - 15Z_p)/384$$

$$g_4 = (79Z_p^9 + 776Z_p^7 + 1482Z_p^5 - 1920Z_p^3 - 945Z_p)/92160$$

Where
$Z_p$ and N are previously defined herein;
R = root-mean-square average of residuals in diminished data set;
T = normalized T statistic.

Figure 2E:
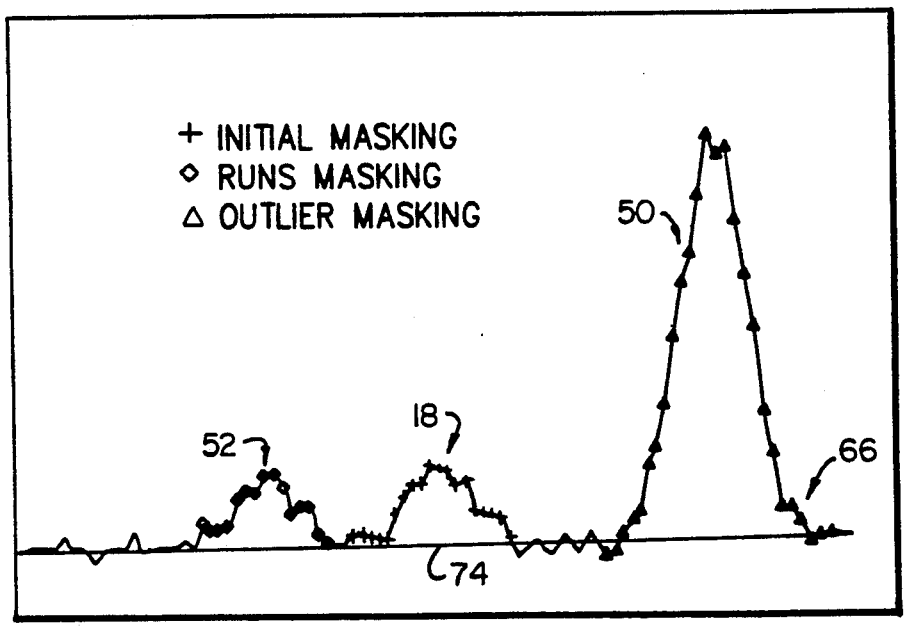

If the largest residual exceeds the T statistic, the outlier test is deemed positive. If the T-test is positive the largest residual is considered an outlier, and its wavelength $L_3$ is determined 60. A further subsequent masking width is selected 62 and the runs-diminished data then are masked 64 at the outlier wavelength over the selected masking width. A runs-diminished smooth curve is refitted 65 to the masked runs-diminished data. (The latter steps 62, 64,65, may be the same subroutines as corresponding steps 49,51,53, but are shown separated herein for clarity.) FIG. 2E shows an outlier 66 masked at the right side at wavelength $L_3$.

Further iterations are carried out with cumulatively masked runs diminished data, through the steps of counting 55, processing 44 and reprocessing 56 until no further runs and outliers are detected, and these iterations are terminated 68. Thus the spectral data are further modified into a set of runs-and-outlier diminished data, and the last runs-and-outlier diminished smooth curve remains fitted to the runs-and-outlier diminished data.

In the example spectrum of FIGS. 2A-2E, only one outlier was found and there was no further iteration.

FIG. 2E shows the final smooth curve 74 computed from the finally diminished data. This curve (a straight line) clearly does not incorporate spectral data from the masked peaks. This curve may be employed as the final smooth curve for the background, or the final curve is fitted 76 (FIG. 3), after decompressing 72 as described below.

The masking preferably is selected (49,62) so as to provide decreasing masking width successively for each step of masking. This is done so as to provide sufficient masking without losing too many points in the spectral data for determining background. The initial masking width $W_o$ applied to the full spectral data, is desirably determined as a low multiple of the typical band width B at full width half maximum (FWHM) of the spectral peak of the analyte. After experimentation a suitable initial masking width $W_o$ was determined to be about 2.5B (2.5 times B).

A suitable formula was determined for calculating the subsequent decreasing masking width W for each step of masking, the formula being $W = W_o e^{(af+b)}/[1 + e^{(af+b)}]$, where $W_o$ is the initial masking width, f is fraction of data points (from the original spectral data) remaining unmasked, and a and b are empirical terms calculated from the formula for two different preselected values of W. The empirical terms are advantageously defined such that, when 99% of the points remain unmasked (i.e. at the beginning of the procedure), W is 95% of $W_o$; and when 99% of the points are masked, W is 5% of $W_o$. This defines a as about $-6$ and b as about $+3$ (more exactly $a = -6.00905$ $b = 3.00452$).

As the spectral data is in discrete increments of wavelength, W is in units of these increments and is rounded down to the nearest whole number of increments. When the calculation yields less than one, $W = 1$ is used. For example for a spectrometer having ten wavelength increments over the FWHM, $W_o$ would be 25 increments (2.5 bandpasses). If no points have been masked yet after a first runs test, $W = 24$. As the iteration proceeds, W becomes smaller.

For the steps 44 of testing for runs, the significance levels preferably are selected 46 so as to decrease the significance level successively for each step of performing. The progressive decrease in the significance level addresses a problem of repeated significance testing as described by K. Abt, "Problems of Repeated Significance Testing", *Controlled Clinical Trials*, 1, 377-381 (1981). The present embodiment implements a Bonferroni adjustment to the significance level. Conveniently this comprises preselecting an initial significance level, counting 55 the number of cycles of processing to reach each current step of selecting, and computing the significance level for said current step as being equal to the initial significance level divided by the number of steps.

For the steps of reprocessing for outliers, the significance level preferably is selected each time by dividing the initial level by the total number of steps of processing and reprocessing to reach each current step, and further dividing by the number of points remaining unmasked upon reaching current step. For example, if the initial significance level is 0.25, to identify an outlier on the fourth time of processing and reprocessing, with 50 remaining data points, the selected significance level is $0.25/(4*50) = 0.00125$.

Sometimes a failure mode may be exhibited when there are large non-analyte features in the spectrum. In such cases, iteration may "lock on" to the large feature and mask the background regions. A weighted fit or logarithmic transform, or preferably both together, may be implemented to reject this failure mode. Thus, in one aspect of the invention as shown in FIG. 3, prior to the step of initially fitting 42, the spectral data are weighted 40 inversely with wavelength distance of a data point from the characteristic wavelength. This is conveniently effected by using as units the number of wavelength increments as a measure of wavelength distance. If the distance from the analyte peak is 30 increments, the weighting factor is 1/30.

In a further aspect, the spectral data are compressed 38 before the step of initially fitting, and if weighting is also applied, prior the step of weighting. Compressing is accomplished by taking a logarithm (conveniently base 10) of each spectral data point. This results in a range compression that effectively emphasizes the background noise while de-emphasizing spectral features.

After termination of the iterative masking, those data remaining unmasked are decompressed 72 (inverse logarithm). The final smooth curve 74 (FIG. 2E) is fitted 76 to the decompressed data. This remaining data will be the runs diminished data or, if retesting for outliers also is effected, the runs-and-outlier diminished data. The final curve is then used as the estimated background level for correcting the spectral data. Optionally, prior to the final curve fit the remaining data are also unweighted (by the reciprocal of weighting).

Programming of the foregoing steps, as outlined by the flow chart of FIG. 3 and the formulas for curve fitting, runs test and T-test, is conveniently and readily achieved with a conventional computer system such as "C" generally available through the supplier of the operating system utilized with the computer. The program may be compiled, for example, on a Digital Equipment Corporation Model 316 SX computer associated with the spectrometer.

It will be appreciated that the invention may be utilized with other analytical instruments, such as gas or liquid chromatography instruments, which provide a functional output signal (e.g. a spectrum for a spectrometer) vs. a selected independent variable (e.g. wavelength in a spectrum). Such a signal has a background level and a functional peak comparable to a spectral peak, the peak being at a characteristic value of the independent variable, characteristic of the analyte being tested. In the case of a chromatogram the peak shows in an elution plot against time as the selected independent variable. The determination of background and correction of the functional data then may be effected as described herein for spectral data.

While the invention has been described above in detail with reference to specific embodiments, various changes and modifications which fall within the spirit of the invention and scope of the appended claims will become apparent to those skilled in this art. Therefore, the invention is intended only to be limited by the appended claims or their equivalents.

What is claimed is:

1. A method of producing spectra corrected for background level, with a spectrographic instrument including means for effecting a spectrum having a background level and a spectral peak at a characteristic wavelength, means receptive of the spectrum for generating and storing spectral data as discrete data points, and means for processing and displaying the spectral data, the method comprising operating the instrument so as to generate and store a set of spectral data, ascertaining background level in the spectral data, subtracting points in the background level from corresponding discrete data points to produce corrected spectral data, and displaying the corrected spectral data, wherein the step of ascertaining background level comprises:

initially masking the spectral data at the characteristic wavelength over a preselected initial masking width, thereby modifying the spectral data into a set of initially diminished data;

initially fitting a smooth curve to the initially diminished data;

processing the spectral data by selecting a statistical significance level, performing a runs test on residuals of the diminished data with respect to the smooth curve so as to detect a largest run, determining a wavelength for a largest residual of the largest run or a median wavelength for the largest run, masking the diminished data at the determined wavelength over a selected subsequent masking width, and refitting a smooth curve to the masked diminished data;

iterating, with residuals for cumulatively masked diminished data, the steps of processing until the number of runs is not significant, thereby further modifying the spectral data into a set of runs diminished data; and employing runs diminished data in fitting a final smooth curve representing the background level for producing the corrected spectral data.

2. The method according to claim 1 wherein the determined wavelength is the wavelength for the largest residual.

3. The method according to claim 1 wherein the step of ascertaining further comprises, before the step of initially fitting, weighting the spectral data inversely with wavelength distance from the characteristic wavelength.

4. The method according to claim 3 wherein the step of ascertaining further comprises, before the step of weighting, compressing the spectral data with a logarithmic transformation, and the step of employing comprises decompressing the runs diminished data before fitting the final smooth curve.

5. The method according to claim 1 wherein the step of ascertaining further comprises, before the step of initially fitting, compressing the spectral data with a logarithmic transformation, and the step of employing comprises decompressing the runs diminished data before fitting the final smooth curve.

6. The method according to claim 1, wherein the step of selecting comprises preselecting an initial significance level, and decreasing the significance level from the initial significance level successively for each subsequent step of performing.

7. The method according to claim 6 wherein the step of decreasing comprises counting number of cycles of processing to reach each current step of performing, and computing the significance level for said current step as being equal to the initial significance level divided by the number of cycles.

8. The method according to claim 1 wherein the step of ascertaining further comprises decreasing the subsequent masking width successively for each step of masking.

9. The method according to claim 8 wherein the step of decreasing comprises computing the subsequent masking width W for each step of masking with the formula $W = W_o e^{(af+b)}/[1 + e^{(af+b)}]$, where $W_o$ is the initial masking width, f is fraction of data points remaining unmasked, and a and b are empirical terms calculated from the formula for two different preselected values of W.

10. The method according to claim 9 wherein a is about $-6$ and b is about $+3$.

11. The method according to claim 1 wherein the runs test is non-parametric.

12. The method according to claim 1 wherein the smooth curve is a straight line, and steps of fitting and refitting the smooth curve comprise least squares fitting the straight line.

13. The method according to claim 1 wherein the analytical instrument comprises an inductively coupled plasma spectrophotometer.

14. The method according to claim 1 wherein a runs diminished smooth curve remains fitted to the runs diminished data, and the step of employing comprises using the runs diminished smooth curve as the final smooth curve.

15. The method according to claim 1 wherein a runs-diminished smooth curve remains fitted to the runs diminished data, and the step of employing comprises:

processing the spectral data by designating a statistical significance level, executing an outlier test on residuals of the runs-diminished data with respect to the runs diminished smooth curve so as to detect whether a largest outlier exceeds the significance level, and if a largest outlier so exceeds, determining an outlier wavelength for said outlier, masking the runs diminished data at the outlier wavelength over a selected further subsequent masking width, and refitting a smooth curve to the masked runs diminished data;

iterating, with cumulatively masked runs diminished data, the steps of reprocessing until no further outlier exceeds the significance level, thereby further modifying the spectral data into a set of runs-and-outlier diminished data; and utilizing the runs-and-outlier diminished data in fitting the final smooth curve.

16. The method according to claim 15 wherein the step of employing further comprises, subsequent to initially processing and prior to each further reprocessing, further iterating the steps of processing until the number of runs is not significant, thereby further modifying the spectral data into a set of further runs diminished data.

17. The method according to claim 15 wherein the step of ascertaining further comprises, prior to the step of initially fitting, weighting the spectral data inversely with wavelength distance from the characteristic wavelength.

18. The method according to claim 17 wherein the step of ascertaining further comprises, prior to the step of weighting, compressing the spectral data with a logarithmic transformation, and the step of utilizing comprises decompressing the runs-and-outlier diminished data before fitting the final smooth curve.

19. The method according to claim 15 wherein the step of ascertaining further comprises, prior to the step of initially fitting, compressing the spectral data with a logarithmic transformation, and the step of utilizing further comprises decompressing the runs-and-outlier diminished data prior to fitting the final smooth curve.

20. The method according to claim 15 wherein the step of designating comprises preselecting an initial significance level, counting total number of cycles of processing and reprocessing to reach each current step of executing, counting number of points remaining unmasked upon reaching said current step, and computing the significance level for said subsequent step as being equal to the initial significance level divided by the number of cycles and further divided by the number of points remaining.

21. The method according to claim 20 wherein the step of selecting comprises computing the significance level for said current step as being equal to the initial significance level divided by the number of cycles.

22. The method according to claim 15 wherein the step of ascertaining further comprises decreasing the subsequent masking width successively for each step of masking.

23. The method according to claim 22 wherein the step of decreasing comprises computing the subsequent masking width W for each step of masking the formula $W = W_o e^{(af+b)}/[1+e^{(af+b)}]$, where $W_o$ is the initial masking width, f is fraction of data points remaining unmasked, and a and b are empirical terms calculated from the formula for two different preselected values of W.

24. The method according to claim 23 wherein a is about $-6$ and b is about $+3$.

25. The method according to claim 15 wherein the runs test is non-parametric and the outlier test is parametric.

26. The method according to claim 15 wherein the smooth curve is a straight line, and the steps of fitting and refitting the smooth curve comprise least squares fitting the straight line.

27. The method according to claim 15 wherein a runs-and-outlier diminished smooth curve remains fitted to the runs-and-outlier diminished data, and the step of utilizing comprises using the runs-and-outlier diminished smooth curve as the final smooth curve.

28. The method according to claim 15 wherein the analytical instrument comprises an inductively coupled plasma spectrophotometer.

* * * * *